United States Patent [19]

De Boer

[11] 4,358,736
[45] Nov. 9, 1982

[54] PHASE COMPARISON CIRCUIT

[75] Inventor: Jacob De Boer, Eindhoven, Netherlands

[73] Assignee: U.S. Philips Corporation, New York, N.Y.

[21] Appl. No.: 168,840

[22] Filed: Jul. 10, 1980

[30] Foreign Application Priority Data

Jul. 17, 1979 [NL] Netherlands ..................... 7905540

[51] Int. Cl.³ .............................................. G01R 25/04
[52] U.S. Cl. .................................. 328/133; 328/151; 331/25
[58] Field of Search ....................... 328/133, 134, 151; 307/514, 516, 523; 331/25

[56] References Cited

U.S. PATENT DOCUMENTS 3,602,826 8/1971 List et al. ..................... 328/151 X
3,863,080 1/1975 Steckler .......................... 328/133 X
4,024,414 5/1977 Gurry .................................. 307/523

Primary Examiner—John S. Heyman
Attorney, Agent, or Firm—Robert T. Mayer; Bernard Franzblau

[57] ABSTRACT

A phase comparison circuit for comparing first and second pulse trains applied to first and second inputs (1 and 2) respectively, comprises a sawtooth signal generator (11,3) which is phase-locked to the first pulse train ($V_A$) by means of a frequency control loop comprising a first sampling circuit (4,5) and an amplifier (12). The output signal of the sawtooth generator is sampled when each pulse occurs in the second pulse train ($V_B$) by means of a second sampling circuit (8,9). In order that a phase difference of zero between the two pulse trains can be accurately determined, whatever their actual repetition frequency, the output signal of the arrangement is formed by means of a differential amplifier (10) as the difference between the output signals of the two sampling circuits.

6 Claims, 3 Drawing Figures

PHASE COMPARISON CIRCUIT

The invention relates to a phase comparison circuit arrangement for comparing the phases of first and second pulse trains applied in operation to first and second inputs, respectively thereof. This arrangement comprises a generator circuit having a control input coupled to said first input, which generator circuit is constructed to generate at an output thereof a sawtooth signal having a phase which is locked to that of said first pulse train when said first pulse train is applied to said first input. A sampling circuit has a sampled signal input to which said output is coupled and a sampling signal input to which said second input is coupled, for sampling the sawtooth signal at said output under the control of the pulses of the second pulse series.

In a known phase comparison circuit arrangement of this kind, the generator circuit is a ramp generator circuit which is started by each pulse of the first pulse train. A pulse of the second pulse train which appears during the generation of a ramp in response to the occurrence of a pulse of the first pulse train causes the output signal of the generator to be sampled and the value of the sample obtained is a measure of the time difference between the two pulses, and hence of the instantaneous phase difference between the two pulse trains. In order to also determine the phase difference when the pulses of the second pulse train lead those of the first pulse train (negative phase), the pulses of the second pulse train are applied to the sampling signal input of the sampling circuit after having been delayed by a period of time which corresponds to half the nominal period of the first pulse train. When the phase difference equals zero, the value of the sample taken by the sampling circuit corresponds to the value of the sawtooth generated by the generator circuit half-way through a period of the sawtooth.

This known phase comparison circuit arrangement has the drawback that the accuracy with which phase differences around zero can be determined is determined by the accuracy with which the aforesaid time delay is equal to a half-period of the sawtooth. Moreover, if this time delay is fixed, the phase comparison circuit only operates satisfactorily when the pulse series have a particular frequency because deviations from this frequency give rise to changes in the values of the samples obtained when the phase difference is equal to zero.

The invention has for an object to provide a phase comparison circuit arrangement of the kind set forth in the first paragraph which need not have these drawbacks. The invention provides a phase comparison circuit arrangement for comparing the phases of first and second pulse series applied in operation to first and second inputs, respectively, thereof, said arrangement comprising first and second sampling circuits and a generator circuit having a control input coupled to said first input via the second sampling circuit. The generator circuit is constructed to generate at an output thereof a sawtooth signal having a phase which is locked to that of said first pulse series when said first pulse series is applied to said first input. The first sampling circuit has a sampled signal input to which said output is coupled and a sampling signal input to which said second input is coupled. The first sampling circuit samples the sawtooth signal at said generator output under the control of the pulses of the second pulse series. The second sampling circuit has a signal input coupled to the generator output and a sampling input coupled to said first input whereby the sawtooth signal at the generator output is sampled under the control of the pulses of the first pulse train. A difference circuit is provided having first and second inputs coupled to the respective outputs of the first and second sampling circuits so as to determine the difference of the samples taken by said first and second sampling circuits.

Because such an arrangement can be constructed so that, when the phase difference between the two pulse series equals zero, both sampling circuits take a sample simultaneously, it can be arranged that, in such a case, the difference between these samples automatically equals zero, regardless of any drift occurring in the amplitude of the sawtooth. Drifting of the amplitude of the sawtooth need only affect the sensitivity of the phase comparison circuit, i.e. the value of the output signal thereof obtained for a given phase difference.

In order to enable the arrangement to automatically operate satisfactorily over the maximum range of phase differences in both directions (positive and negative phase differences) for various values of the repetition rate of the pulses of the first pulse series, the second sampling circuit may be included in an output frequency control loop of said generator circuit, which loop is arranged to lock the phase of said sawtooth signal to that of said first pulse series. If this is done it can be arranged that the pulses of the first pulse series automatically occur halfway through each period of the sawtooth.

An embodiment of the invention will be described in detail hereinafter by way of example, with reference to the accompanying diagrammatic drawing, in which.

Figure 1:
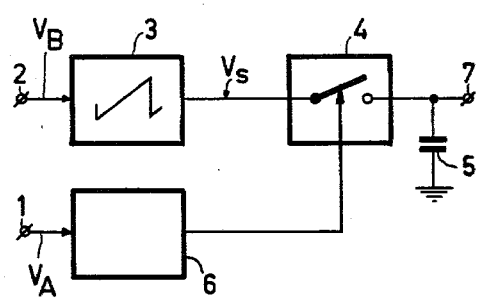
FIG. 1 shows a known phase comparison circuit.

FIG. 1 shows a known phase comparison circuit which has a first input 1 and a second input 2 for receiving first ($V_A$) and second ($V_B$) pulse series, respectively. In a motor control system, for example, the pulse series $V_B$ may be a reference pulse series and the pulse series $V_A$ may be a pulse series originating from a tachogenerator. The input 2 is connected to a ramp generator 3 which is reset each time a pulse appears on the input 2. The input 1 is connected, via a delay network 6 which produces a delay equal to half the nominal period of the sawtooth $V_S$ appearing on the output of the ramp generator 3 when the pulse series $V_A$ is applied to the input. The delayed signal thus is fed to the control input of an (electronic) switch 4 which briefly connects a sampling capacitor 5 to the output of the ramp generator 3 each time a pulse appears. The voltage across the capacitor 5 is fed to an output 7.

The operation of the circuit shown in FIG. 1 is as follows: A pulse of the pulse series $V_B$ which is applied to the input 2 starts the generation of a voltage ramp. When at a given instant the switch 4 is briefly closed due to the occurrence of a pulse of the pulse series $V_A$, the voltage across the capacitor 5 and hence on the output 7 becomes equal to the value of the ramp at that instant. This value is linearly proportional to the time difference between the instant that this ramp started and the instant at which its value is sampled. This time difference minus the delay introduced by the network 6 is proportional to the phase difference between the pulse series $V_A$ and $V_B$, the value of the sawtooth being sampled halfway through each period thereof if this phase difference is equal to zero, provided that the delay produced by the network 6 corresponds to exactly half this period.

Figure 2:
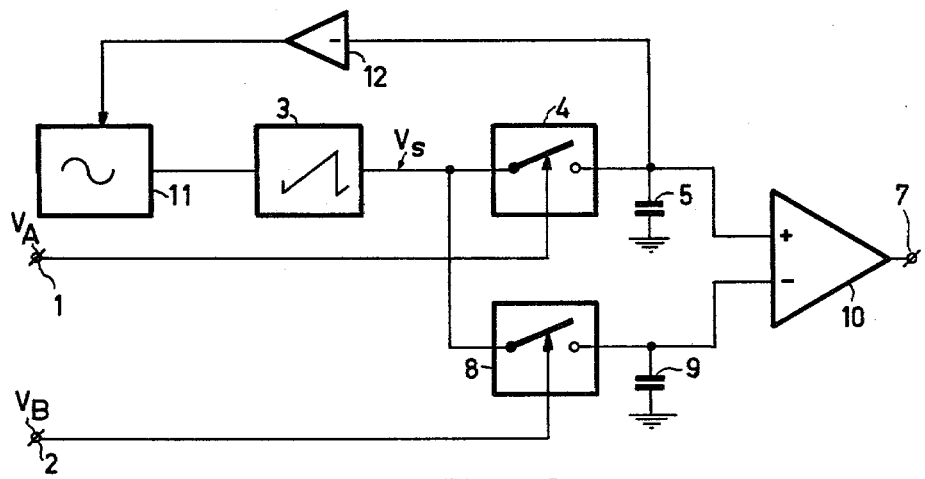
FIG. 2 shows an embodiment of the invention.

FIG. 2 shows an embodiment of the invention. Contrary to the circuit shown in FIG. 1, the ramp generator 3 in the phase comparison circuit of FIG. 2 is not reset by the pulse series $V_B$ but by an oscillator 11. Elements 3 and 11 may alternatively be replaced by a self-oscillating sawtooth generator if desired. In comparison with the circuit shown in FIG. 1, the circuit shown in FIG. 2 additionally includes a second sampling circuit comprising a sampling capacitor 9 and a switch 8, the latter being connected between the capacitor 9 and the ramp generator 3. The switch 8 is briefly closed each time a pulse occurs in the pulse series $V_B$. The two sampling capacitors 5 and 9 are connected to the output 7 via respective inputs of a differential amplifier 10. The network 6 of FIG. 1 is omitted from the arrangement of FIG. 2.

Figure 3:
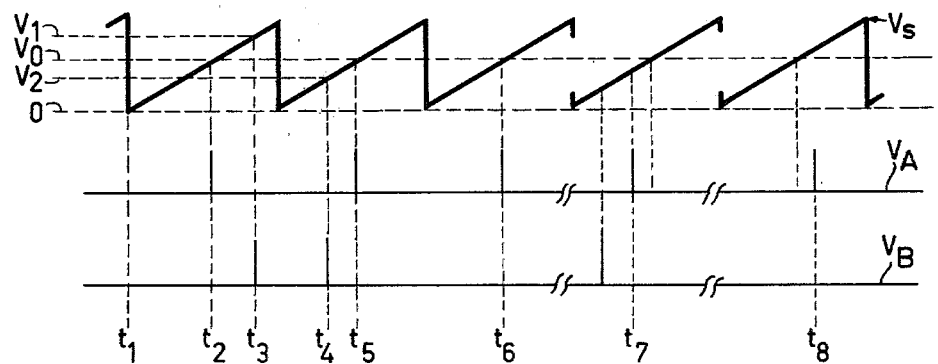
FIG. 3 shows some waveforms in order to illustrate the operation of the embodiment of FIG. 2.

In order to illustrate the operation of the phase comparison circuit shown in FIG. 2, FIG. 3 shows the variation of the output voltage $V_S$ of the ramp generator 3 as a function of time, an example of the pulse train $V_A$ on the input 1, and an example of the pulse train $V_B$ on the input 2. At a given instant $t_1$, a period of the sawtooth $V_S$ commences. At the instant $t_2$, a pulse appears in the signal $V_A$ on the input 1 and the capacitor 5 is charged to the voltage value $V_0$ which the sawtooth $V_S$ has at that instant. At the instant $t_3$, a pulse appears in the signal $V_B$ on the input 2 and the capacitor 9 is charged to the voltage value $V_1$ which the sawtooth $V_S$ has at the instant $t_3$. The voltage at the output 7 thus becomes equal to $A(V_0-V_1)$, A being the gain factor of the amplifier 10. This voltage is a measure of the difference $t_3-t_2$, and hence of the instantaneous phase difference between the two pulse trains $V_A$ and $V_B$. The circuit also detects phase differences in the other direction, this being illustrated in FIG. 3 where at the instant $t_4$ a pulse occurs in the pulse series $V_B$ and subsequently a pulse occurs in the pulse series $V_A$ at the instant $t_5$. The output voltage of the amplifier 10 becomes equal to $A(V_0-V_2)$ at the instant $t_5$.

The amplitude of the sawtooth affects only the sensitivity of the arrangement. If the phase difference between the signals $V_A$ and $V_B$ is equal to zero, both capacitors 5 and 9 are charged to the same voltage, so that the output voltage of the amplifier 10 is zero, regardless of the amplitude of the sawtooth $V_S$.

The circuit is also substantially non-responsive to the occasional omission of pulses from the pulse series $V_A$ and/or $V_B$ because in such a case the relevant sampling capacitor 5 or 9 retains the sample last taken.

It will be noted that the pulses of the pulse series $V_A$ occurring at the instants $t_2$, $t_5$ and $t_6$ each occur halfway through the relevant period of the sawtooth $V_S$. If this were not the case, as illustrated by pulses occurring at the instants $t_7$ and $t_8$, the range over which the phase difference between the two pulse series could be determined without error would be reduced in one of the two directions (positive or negative). This possibility is prevented by constructing the oscillator 11 as a voltage-controlled oscillator the frequency of which is controlled in a stabilizing sense, via an amplifier 12, by means of the voltage across the capacitor 5. If the voltage across the capacitor 5 increases, caused by the occurrence of the pulses of the pulse series $V_A$ more than halfway through the relevant periods of the sawtooth $V_S$, the control voltage applied to the oscillator 11 decreases, reducing the repetition frequency of the sawtooth $V_S$, so that its period increases. If the voltage across the capacitor 5 decreases, the opposite takes place. Thus, the sawtooth generator 3, 11 is controlled so that the centre of each ramp in the sawtooth $V_S$ coincides with the relevant pulse of the pulse series $V_A$. As a result, the repetition frequency of the sawtooth $V_S$ is also maintained equal to the repetition frequency of the pulse series $V_A$. As an alternative elements 11 and 12 may be omitted and the ramp generator 3 may be triggered instead by means of delayed pulses of the pulse series $V_A$ derived from the input 1.

What is claimed is:

1. A phase comparison circuit for comparing the phase of a first train of pulses with that of a second train of pulses comprising, first and second inputs for receiving said first and second pulse trains, respectively, a sawtooth generator having a control input and constructed to generate at an output thereof a sawtooth signal, a first sampling circuit having a signal input connected to said generator output and a sampling input coupled to said second input for sampling the sawtooth signal at said generator output under the control of the pulses of the second pulse train, a second sampling circuit having a signal input coupled to said generator output and a sampling input coupled to said first input for sampling the sawtooth signal at said generator output under the control of the pulses of the first pulse train, means coupling said sawtooth generator control input to the second sampling circuit so that the sawtooth signal generated is phase-locked to a first pulse train applied to said first input, and a differencing circuit having first and second inputs coupled to the respective outputs of said first and second sampling circuits for determining the difference between the values of the samples taken by the first sampling circuit and those of the second sampling circuit.

2. A phase comparison circuit as claimed in claim 1 wherein the second sampling circuit is included in an output frequency control loop of said sawtooth generator, said control loop being arranged to lock the phase of said sawtooth signal to that of said first pulse train.

3. A phase comparison circuit for comparing first and second pulse trains which may initially have different frequencies comprising, first and second input terminals for receiving said first and second pulse trains, respectively, first and second sampling means each having a signal input and a switching input, means coupling said first and second input terminals to said switching inputs of said second and first sampling means, respectively, a sawtooth generator having an output coupled to the signal inputs of said first and second sampling means so that the first and second sampling means sample a sawtooth output signal of the generator under control of the pulses of said second and first pulse trains, respectively, a frequency control loop including said second sampling means coupled to the sawtooth generator whereby the sawtooth output signal of the generator is phase-locked to the first pulse train, and a differential amplifier having first and second inputs coupled to respective outputs of said first and second sampling means and an output for deriving an output signal indicative of the phase difference between said first and second pulse trains appearing at the first and second input terminals 4. A phase comparison circuit as claimed in claim 3 wherein each of said sampling means includes switching means having an input coupled to the output of the sawtooth generator, a control input coupled to its respective input terminal, and an output coupled to a respective signal storage means and a respective input of the differential amplifier, and said frequency control loop includes an amplifier coupled between the output of the switching means of the second sampling means and a frequency control input of the sawtooth generator.

5. A phase comparison circuit as claimed in claims 3 or 4 wherein the frequency control loop controls the sawtooth generator frequency so that the pulses of the first pulse train occur at the halfway point of the linear portion of the sawtooth signal.

6. A phase comparison circuit as claimed in claim 4 wherein the storage means each comprise a capacitor and the sawtooth generator comprises an oscillator and a ramp generator in cascade, said oscillator having a control input for adjusting its frequency and thereby the frequency of the ramp generator, said oscillator control input being coupled to the capacitor at the output of the switching means of the second sampling means via said amplifier so that an increase of the capacitor voltage causes a reduction in the repetition frequency of the sawtooth signal, and vice versa, thereby to maintain the frequency of the sawtooth signal equal to the frequency of the first pulse train.

* * * * *